(12) United States Patent
Marr et al.

(10) Patent No.: US 9,320,166 B1
(45) Date of Patent: Apr. 19, 2016

(54) MULTI-SHELF POWER-POOLING BUS

(71) Applicant: Amazon Technologies, Inc., Reno, NV (US)

(72) Inventors: Michael David Marr, Monroe, WA (US); Peter George Ross, Olympia, WA (US); David Edward Bryan, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 483 days.

(21) Appl. No.: 13/693,970

(22) Filed: Dec. 4, 2012

(51) Int. Cl.
H05K 7/14 (2006.01)

(52) U.S. Cl.
CPC ........................................ *H05K 7/14* (2013.01)

(58) Field of Classification Search
CPC ............. G06F 1/16; G06F 1/263; H02B 1/26; H02B 1/181; H02G 1/00; H05K 5/00; H05K 7/00; H05K 7/16; H02J 1/00; H02J 1/14; H02J 1/10; H02J 3/382; Y10T 307/305
USPC ................................................. 361/724–727
See application file for complete search history.

(56) References Cited

U.S. PATENT DOCUMENTS

| | | | | |
|---|---|---|---|---|
| 5,099,391 A | * | 3/1992 | Maggelet et al. ............. | 361/736 |
| 5,746,976 A | | 5/1998 | Yamada et al. | |
| 6,996,458 B2 | * | 2/2006 | Pincu et al. .................... | 700/297 |
| 7,123,485 B1 | * | 10/2006 | Henderson .......... | H01M 2/1005 211/209 |
| 7,138,733 B2 | * | 11/2006 | Sanders ............... | H05K 7/1492 307/147 |
| 7,142,951 B2 | * | 11/2006 | Pincu et al. .................... | 700/297 |
| 7,146,258 B2 | * | 12/2006 | Pincu et al. .................... | 700/297 |
| 7,159,129 B2 | * | 1/2007 | Pincu ....................... | G06F 1/263 307/18 |
| 7,363,525 B2 | * | 4/2008 | Biederman ............. | H04L 12/10 709/230 |
| 7,400,062 B2 | * | 7/2008 | Pincu et al. ..................... | 307/29 |
| 7,434,743 B2 | * | 10/2008 | Barsun et al. ................ | 236/49.3 |
| 7,446,491 B2 | * | 11/2008 | O'Higgins ................ | H02J 1/10 174/43 |
| 7,646,590 B1 | * | 1/2010 | Corhodzic ........... | H05K 7/1492 361/622 |
| 7,903,809 B2 | * | 3/2011 | Karam ....................... | G06F 1/26 379/413 |
| 8,219,839 B2 | * | 7/2012 | Akimoto .................... | G06F 1/26 713/300 |
| 8,363,373 B2 | * | 1/2013 | Atluri et al. .................... | 361/103 |
| 2003/0065958 A1 | * | 4/2003 | Hansen et al. ................ | 713/300 |
| 2003/0188885 A1 | * | 10/2003 | Niinobe et al. .............. | 174/73.1 |
| 2003/0223193 A1 | * | 12/2003 | Smith ................... | H05K 7/1488 361/679.48 |
| 2003/0223199 A1 | * | 12/2003 | Smith ..................... | G06F 1/181 361/727 |
| 2005/0030720 A1 | * | 2/2005 | King ..................... | H05K 7/1487 361/725 |
| 2005/0068716 A1 | * | 3/2005 | Pereira ........................... | 361/624 |

(Continued)

OTHER PUBLICATIONS

OPEN Compute Project, "Open Rack Hardware V1.0", Pierluigi Sarti, et al., Sep. 18, 2012, pp. 1-16.

(Continued)

*Primary Examiner* — Anthony Haughton
*Assistant Examiner* — Matt Dhillon
(74) *Attorney, Agent, or Firm* — Roebrt C. Kowert; Meyertons, Hood, Kivlin, Kowert & Goetzel, P.C.

(57) ABSTRACT

A system includes a rack, a plurality of shelves, a plurality of shelf-mountable electrical systems, and an inter-shelf power-pooling bus. The inter-shelf power-pooling bus is coupled to a power output of a shelf power supply mechanism on each of the shelves and a power input of a shelf computing device on each of the shelves. The inter-shelf power-pooling bus supplies pooled power from the shelf power supply mechanisms coupled to the inter-shelf power bus to the shelf computing devices coupled to the inter-shelf power-pooling bus.

26 Claims, 12 Drawing Sheets

(56) References Cited

U.S. PATENT DOCUMENTS

| | | | | |
|---|---|---|---|---|
| 2005/0081069 A1* | 4/2005 | Pincu | G06F 1/263 | 713/300 |
| 2005/0146219 A1* | 7/2005 | Pincu et al. | | 307/18 |
| 2006/0082222 A1 | 4/2006 | Pincu et al. | | |
| 2007/0230113 A1* | 10/2007 | Chiang | G06F 1/181 | 361/679.47 |
| 2009/0034181 A1* | 2/2009 | Gizycki | H01R 13/652 | 361/679.02 |
| 2009/0134703 A1* | 5/2009 | Chung | H02J 1/102 | 307/64 |
| 2011/0320826 A1* | 12/2011 | Simmons | G06F 1/26 | 713/300 |
| 2012/0026667 A1* | 2/2012 | Atluri et al. | | 361/679.31 |

OTHER PUBLICATIONS

Circuit, "Fuji Electric UL 489 Rated Molded Case Circuit Breakers (MCCBs)", downloaded Jun. 15, 2012, pp. 1-4.

U.S. Appl. No. 13/540,369, filed Jul. 2, 2012, Michael P. Czamara.

"Cisco Switch Guide—Scalable, intelligent LAN switching for campus, branch and data center networks of all sizes" Version 7, Cisco, Summer 2011, pp. 1-134.

"Cisco Nexus 7000 Series Environment" 2008-2010 Cisco, pp. 1-9.

"Cisco Nexus 7000 Solutions—New 50/60A 3-phase CDU with Locking Outlets" downloaded Jun. 29, 2011 from http://www.servertech.com/solutions/data-center-power/cisco-nexus-7000/, pp. 1-2.

"PIPS (Per Inlet Power Sensing)—Introducing the best infeed power measurement technology on the market for data center rack-level power monitoring" downloaded Jun. 29, 2011 from http://www.servertech.com/solutions/About_PIPS, pp. 1-3.

U.S. Appl. No. 13/172,173, filed Jun. 29, 2011, John W. Eichelberg.

U.S. Appl. No. 13/693,973, filed Dec. 4, 2012, Michael David Marr.

U.S. Appl. No. 78/693,978, filed Dec. 4, 2012, Michael David Marr.

* cited by examiner

MULTI-SHELF POWER-POOLING BUS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). A network of cabling, bus bars, power connectors, and power distribution units, is used to deliver the power to numerous specific components in the facility.

In some rack-based computing systems, the power supply units for the servers in the rack are not sized to match the electrical loads of the servers. In some cases, the power supply units have excess capacity relative to the loads of a server. In other cases, the power supply units have insufficient capacity to supply power in all of the conditions encountered during operation. In addition, in some rack designs, if one power supply unit fails, the computing devices coupled to the power supply unit may be taken out of service.

Figure 1:
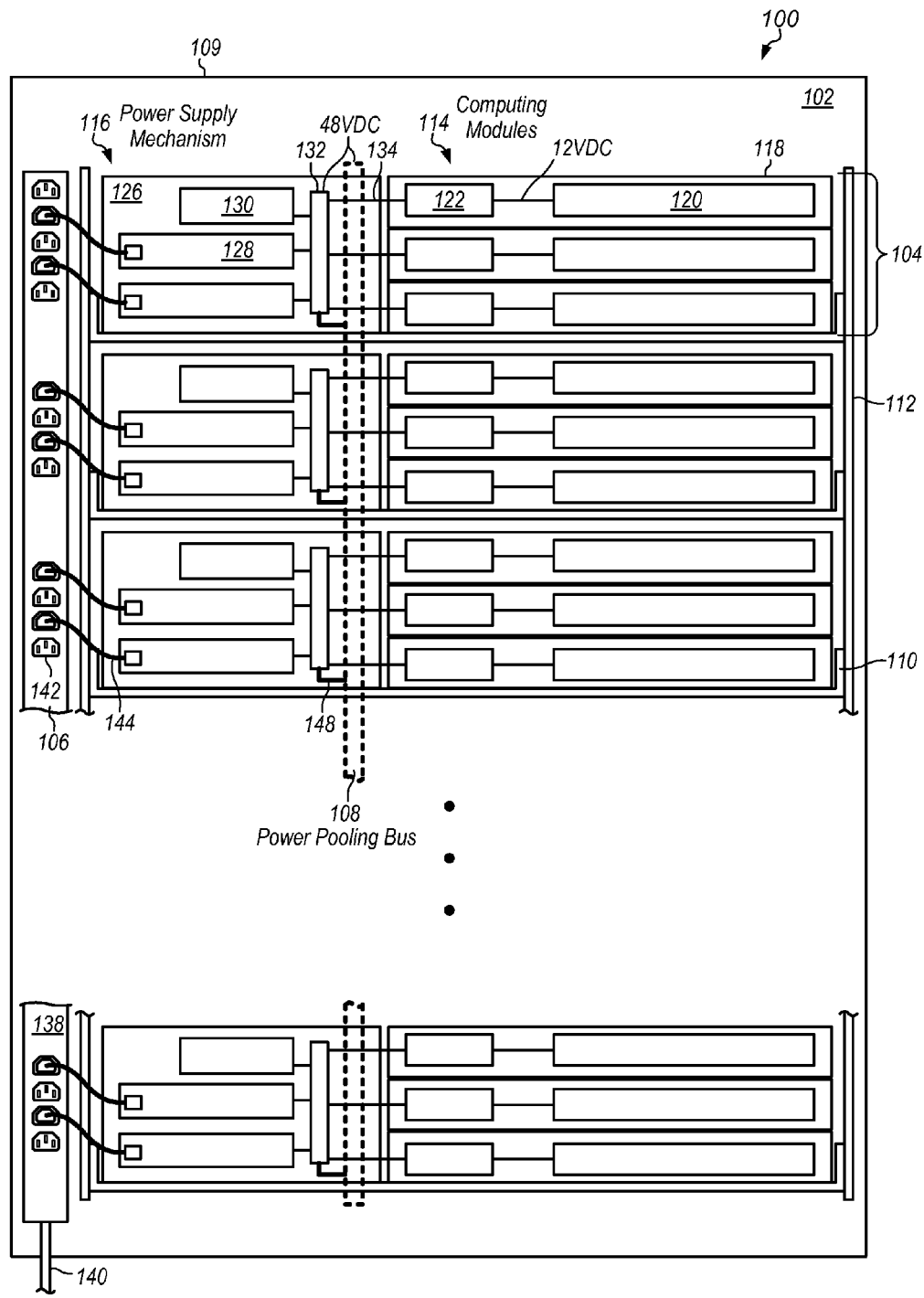
FIG. 1 illustrates one embodiment of system that includes a rack-level power-pooling bus for power supply mechanisms on multiple shelves of a rack.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computing systems, and systems and methods for performing computing operations, are disclosed. According to one embodiment, a system includes a rack, a plurality of shelves, a plurality of shelf-mountable electrical systems, and an inter-shelf power-pooling bus. The electrical systems include chassis, a shelf power supply mechanism that receives power from a power distribution system and supplies power, and shelf computing devices. The inter-shelf power-pooling bus is coupled to a power output of a shelf power supply mechanism on each of two or more of the shelves and a power input of a shelf computing device on one or more of the shelves. The inter-shelf power-pooling bus supplies pooled power from the shelf power supply mechanisms coupled to the inter-shelf power bus to the shelf computing devices coupled to the inter-shelf power-pooling bus.

According to one embodiment, a system includes a rack, a plurality of shelves, a plurality of shelf-mountable electrical systems, and an inter-shelf power-pooling bus. The electrical systems include chassis, a shelf power supply mechanism that receives AC power from a power distribution system and supplies DC power, and one or more shelf computing devices. The inter-shelf power-pooling bus is coupled to a DC power output of a shelf power supply mechanism on each of two or more of the shelves and a power input of a shelf computing device on one or more of the shelves. The inter-shelf power-pooling bus supplies pooled DC power from the shelf power supply mechanisms coupled to the inter-shelf power bus to the shelf computing devices coupled to the inter-shelf power-pooling bus.

According to one embodiment, a method of supplying power to electrical systems in a rack includes coupling a power output of a power supply mechanism in one shelf of a rack to a power output of a power supply mechanism in another shelf of the rack to create a supply of pooled power. Power is supplied from the pooled power to electrical systems (for example, servers) in one or more of the shelves.

According to one embodiment, a system includes a rack with shelves, and one or more groups of shelf-mountable electrical systems. Shelf-mountable electrical systems may include chassis, shelf computing devices, a shelf power supply mechanism, and power-pooling bus elements. For at least one of the groups, a power-pooling bus element of one shelf-mountable electrical systems is electrically coupled to a power pooling bus element of at least one other of the shelf-mountable electrical systems in the group. The power-pooling bus elements form an inter-shelf power-pooling bus for the shelf computing devices in the group.

According to one embodiment, a power-pooling bus element from a power supply mechanism in one slot of a rack is coupled to a power-pooling bus element of a power supply mechanism in another slot of the rack. The power-pooling bus elements combine to form a power-pooling bus for a group of electrical systems (for example, servers) in the rack. Power is supplied from the power-pooling bus to electrical systems in the group.

According to one embodiment, a system includes a rack and electrical systems in slots in the rack. The electrical systems include a power supply mechanism one or more computing devices. Power outputs of the power supply mechanisms in at least two of the slots are coupled to one another to form a pooled power supply system. The pooled power system can supply power from the power supply mechanisms to computing devices in one or more of the slots. The pooled power supply system can activate or deactivate power supply mechanisms of the pooled power supply system based on operating conditions.

According to one embodiment, power is pooled from power supply mechanisms in two or more slots of a rack. Power may be supplied from the pooled power to electrical systems in one or more slots in the rack. The power supply mechanisms can be activated or deactivated from the pool based on operating conditions. Power supply mechanisms can be activated or deactivated based on, for example, conditions of the power supply mechanisms, or conditions of the electrical systems that are receiving power from the pooled power supply system.

As used herein, in the context of a power supply, to "activate" the power supply means to make power available for consumption by an electrical load. Activating a power supply includes, for example, switching a power supply unit on, or closing a switch between a power supply unit and a load. As used herein, in the context of a power supply, to "deactivate" means to make power unavailable for consumption by an electrical load. Deactivating a power supply includes, for example, switching a power supply unit off, or opening a switch between a power supply unit and a load.

As used herein, "chassis" means a structure or element that supports another element or to which other elements can be mounted. A chassis may have any shape or construction, including a frame, a sheet, a plate, a box, a channel, or a combination thereof. In some embodiments, a chassis is a sled that slides in and out the rack on a shelf or other mounting structure. In one embodiment, a chassis is made from one or more sheet metal parts. A chassis for a computing device may support circuit board assemblies, power supply units, data storage devices, fans, cables, and other components of the computing device.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "compute module" means a module that includes one or more computing devices.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such as a base, frame, housing, or container.

As used herein, a "module assembly" includes an assembly of two or more modules.

As used herein, a "rack" means a rack, container, frame, or other element or combination of elements that can contain or physically support one or more electrical systems, such as servers.

As used herein, "room" means a room or a space of a building. As used herein, "computer room" means a room of a building in which computing devices, such as rack-mounted servers, are operated.

As used herein, a "rack unit" or "U" refers to a measure of standard spacing in a rack. One "rack unit", or "U", is nominally 1.75 inches. As used herein, spacing, dimensions, and pitches based on "rack units" or "U" may allow for tolerances, such as manufacturing tolerances.

As used herein, "shelf" means any element or combination of elements on which an object can be rested or mounted. A shelf may include, for example, a plate, a sheet, a tray, a disc, a block, a grid, a box or a set of support rails. A shelf may be rectangular, square, round, or another shape. In some embodiments, a shelf may include one or more rails.

As used herein, a "slot" means a space in a rack into which one or more components can be installed or removed. In some racks, slots are formed between adjacent shelf supports or rails of the rack. A slot of a rack may have any orientation, including horizontal, vertical, or angled. In some embodiments, a slot has a standard height or width, such as 1 U, 2 U, or 3 U.

As used herein, "stack" includes any arrangement of elements in which one element is located at least partially above or over another element. For example, a stack of hard disk drives may include two or more hard disk drives arranged one over another. A "stack" does not require that upper elements in the stack rest on elements lower in the stack. In addition, a "stack" does not require that elements be precisely aligned vertically with respect to one another.

As used herein, "standard" means consistent with one or more standards, such as an industry standard. In some embodiments, a standard rack slot is 19 inches wide.

In various embodiments, a computing system includes a rack, shelf modules in the rack, and electrical modules in the shelf modules. The shelf modules may be reconfigurable to receive different electrical modules. Shelf members in the shelf module may be configurable to form slots for receiving the electrical modules.

In certain embodiments, different electrical modules in a shelf module carry out different functions. For example, a computing system may include some modules that perform computing, some modules that store data, and some modules that provide power to other modules in the computing system. In some embodiments, modules serving different functions are assembled into module assemblies before installation in a rack. In some embodiments, sets of different modules in a rack may be decoupled and rearranged to create different module assemblies.

In some embodiments, different modules in a module assembly are electrically coupled to one another. The coupled modules may combine to form a computing system. For example, a compute module may be physically and electrical coupled to two or more data storage modules and one power module. The power module in the module assembly may supply power to compute module and the data storage module. The compute module may access data on the data storage modules.

In some embodiments, a computing system includes compute modules with horizontally oriented circuit boards on chassis having a width that is half the width or less of a standard slot in a rack. The chassis may be, for example, half the width or less of a slot of a standard 19-inch rack in accordance with Electronic Industries Association EIA-310. Each compute module may be provided on a separate chassis. Two compute modules can be positioned one next to another, two or more deep (for example, one module behind another within a given slot), or both, at each of various levels in the rack.

In some embodiments, a computing system includes one or more data storage modules. Each data storage module may be provided on a separate chassis. Two or more data storage modules can be positioned one next to another, two or more deep (for example, one module behind another within a given slot), or both, at each of various levels in the rack. Each data storage module may include one or more mass storage devices, such as hard disk drives.

In some embodiments, a system includes an inter-shelf power-pooling bus. The inter-shelf power-pooling bus may pool power from power supply mechanisms in computing systems on multiple shelves in the rack. The power supply mechanisms in the computing systems may receive AC power from an external source (such as a floor power distribution unit or UPS) and supply DC power to the inter-shelf power-pooling bus. The inter-shelf power-pooling bus may supply the pooled power to computing devices in the computing systems. In certain embodiments, the pooled power supply mechanisms balance the supply of power among the shelves. For example, an oversized power supply mechanism on one shelf may compensate for an undersized power supply mechanism on another shelf in the pool.

FIG. 1 illustrates one embodiment of system that includes a rack-level power-pooling bus for power supply mechanisms on multiple shelves of a rack. Rack system 100 includes rack 102, shelf computing systems 104, rack power distribution unit 106, and inter shelf power pooling bus 108. Rack 102 includes rack enclosure 109, shelves 110, and posts 112. Shelves 110 may be spaced from top to bottom of rack enclosure 109 on posts 112.

Each of shelf computing systems 104 includes computing modules 114 and power supply mechanism 116. Each of computing modules 114 includes computing module chassis 118, circuit board assembly 120, and DC/DC power converter 122. Circuit board assembly 120 and DC/DC power converter 122 may be enclosed within computing module chassis 118. In some embodiments, a DC/DC converter is integrated with (for example, mounted on) a motherboard for a computing device.

Circuit board assembly 120 may include a circuit board, one or more processors, DIMM slots, and I/O connectors. Circuit board assembly 120 may include various other semiconductor devices, resistors, and other heat producing components. Circuit board assembly 120, along with other components on chassis 118 and/or components external to chassis 118, may operate in conjunction with one another and external components, such as hard disk drives, as a computing device. For example, computing module 114 may be a file server.

Within each shelf computing system 104, local power bus 132 is connected to DC/DC power converters 122 in each of computing modules 114 by way of power lines 134. Power lines 134 may include, in one embodiment, a cable that runs from a connector receptacle on power supply chassis 126 to a connector receptacle on computing module chassis 118. In another embodiment, power lines 134 including a set of sliding contacts on each of power supply chassis 126 and computing module chassis 118. The sliding contacts may electrically couple with one another when computing modules 114 and power supply mechanism 116 are placed on shelf 110.

Each of power supply mechanisms 116 includes power supply mechanism chassis 126, power supply units 128, battery back-up unit 130, and local power bus 132. Power supply mechanism 116 may supply electrical power for processors, hard disk drives, and other components of electrical modules in a computing system. In one embodiment, each of power supply units 128 is a 1 U power supply unit. Power supply mechanism 116 may be withdrawn from the shelf on power supply mechanism chassis 118. In the embodiment shown in FIG. 1, each of power supply mechanism 116 is shown, for illustrative purposes, as including two power supply units and one battery back-up unit. A power supply mechanism may nevertheless in various embodiments have any number of power supply units and any number of battery back-up units. In certain embodiments, a power supply mechanism includes one power supply unit but no battery back-up unit. In certain embodiments, a power supply mechanism includes one battery back-up unit but no power supply unit. In some embodiments, each shelf of system has at least one power supply unit or at least one battery back-up unit.

Power supply unit 128, battery back-up unit 130, and local power bus 132 may be in any orientation, including horizontal, vertical, or angled. In some embodiments, various elements of power supply mechanisms 116 are in different orientations from one another. For example, local power bus 132 may be in a vertical orientation, and power supply unit 128 and battery back-up unit 130 may be in a horizontal orientation.

Power supply units 128 may conform to an industry-recognized standard. In some embodiments, a power supply for a computing system has a form factor in accordance with an industry-recognized standard. In one embodiment, power supply unit 128 is a power supply unit having a standard 1 U form factor. Examples of other standards for a power supply and/or a power supply form factor include 2 U, 3 U, SFX, ATX, NLX, LPX, or WTX.

In some embodiments, computing components and power supply components of a shelf computing system are carried on a common chassis. For example, circuit board assembly 120, DC/DC power converter 122, power supply units 128, battery back-up unit 130, and local power bus 132 may all be enclosed in one chassis. The systems on the common chassis may form a shelf computing unit.

In the embodiment shown in FIG. 1, shelf computing system 104 includes three computing modules. A shelf computing system may nevertheless in various embodiments have any number of computing modules. In some embodiments, computing modules of a shelf computing system are arranged side by side on the shelf, or arrayed in rows and columns.

In some embodiments, computing modules of a shelf computing system (such as shelf computing system 104) include data storage devices, such as hard disk drives. In certain embodiments, a shelf computing system includes data storage modules. Each of the data storage modules may include one or more data storage devices mounted on a removable chassis.

Rack power distribution unit 106 includes rack PDU enclosure 138, power input cable 140, and PDU power output receptacles 142. Rack power distribution may receive electrical power from a power distribution system external to rack 102 (such as a floor power distribution unit or UPS) by way of power input cable 140. Power supply units 128 may be coupled to one of PDU power output receptacles 142 by way of power cable 144. In some embodiments, power supply units 128 receive AC power. In one embodiment, each of power supply units 128 receives single-phase AC power at 208 volts. In another embodiment, each of power supply units 128 receives single phase AC power at 230 volts nominal.

Local power buses 132 in each of shelf computing systems 104 are electrically coupled to rack-level power-pooling bus 108 via power lines 148. Power-pooling bus 108 may pool power from power supply mechanisms 116 of shelf computing system 104. The pooled power may be consumed by any or all of computing modules 114 in the various shelf computing systems 104. For example, a portion of the power consumed by computing modules 114 on the shelf computing system 104 at the top of rack 102 may be drawn from the power supply mechanism at the bottom of rack 102 via power pooling bus 108.

In the embodiment illustrated in FIG. 1, local power buses 132 and power-pooling bus 108 carry DC power at about 48 VDC. A power pooling bus may, nevertheless, in various embodiments carry power at other voltages. In one embodiment, the voltage of local power buses 132 and power-pooling bus 108 is less than 60 VDC. In another embodiment, the voltage of local power buses 132 and power-pooling bus 108 is High Voltage DC (for example, at about 400 VDC).

In some embodiments, pooling of power supply mechanisms on multiple shelves of a rack balances power supply to electrical loads of different shelf computing units in the rack. In one embodiment, a power supply mechanism of a computing system on one shelf in a rack supplements power to computing devices or other electrical loads on another shelf of the rack. For example, a pooled 800-watt power supply mechanism in a shelf computing unit with only 600 watts of computing devices may donate power to computing devices of another shelf computing unit having an 800-watt power supply mechanism and 1000 watts of electrical loads.

In some embodiments, pooling of power supply mechanisms on multiple shelves of a rack provides a back-up power supply for electrical loads of different shelf computing units in the rack. In some embodiments, pooled power supply mechanisms improve power supply fault tolerance to a system. For example, if a power supply unit in one shelf computing unit fails, power supply mechanisms on other shelves in the rack may have sufficient capacity in the aggregate to supply the power consumption needs of that shelf.

In some embodiments, a common power supply mechanism is selected for a set of shelf-mountable computing systems based on total requirements for the set of shelf-mountable computing systems. Shelf-mountable computing systems on different shelf-mountable computing systems in the set may have different computing device configurations with different electrical power requirements. When the shelf-mountable computing systems are deployed in a rack, power from power supply mechanism in the shelf-mountable computing systems may be pooled. The pooled power may be supplied to the computing devices of the shelf-mountable computing systems (for example, via power-pooling bus for the rack.

For example, in a rack computing system having a total of 16 shelves, computing devices on shelf-mountable computing systems to be installed on 8 of the shelves of the rack may require 900 watts of power per computing system, while computing devices on shelf-mountable computing systems to be installed on the other 8 shelves of the rack may require 700 watts of power per computing system. In this example, each of the shelf-mountable computing systems may include an 800 watt power supply mechanism. The computing systems that require 900 watts thus have an under-sized power supply mechanism in relation to the computing devices in the computing system. The computing systems that require only 700 watts have an over-sized power supply mechanism in relation to the computing devices in the computing system. In operation, loads in the computing systems that have the undersized power supply mechanisms may receive power from power supply mechanisms that are oversized relative to the devices on their shelf.

In some embodiments, a common power supply mechanism is selected for a set of shelf-mountable computing systems to provide a desired level of power supply fault tolerance for the set of computing systems. For example, power supply mechanisms for a set of computing system may be selected to provide N+1 fault tolerance, or N+2 fault tolerance of power supplies in the rack.

In one embodiment, each shelf contributes more power than it uses such that at a certain density, failure of one or more power supply devices can be handled by power from the other shelves. For example, a rack may include groups of six shelf computing units with pooled power, each with power supply mechanisms that supply up to 800 watts and computing devices that consume up to 630 watts. Upon a loss of one of the power supply mechanisms in the group, the 5 remaining power supply mechanisms (5×800 watts=4,000 watts) may be used to support the electrical loads of all six shelf computing units (6×630 watts=3,780 watts).

In some embodiments, the power is transferred from power supply mechanisms to a power pooling bus at the same voltage that power is supplied from the bus to circuit board assemblies in computing modules. For example, power supply units may supply power to a power pooling bus at 12 VDC, and the power pooling bus supply power to computing unit circuit board assemblies at 12 VDC.

Figure 2:
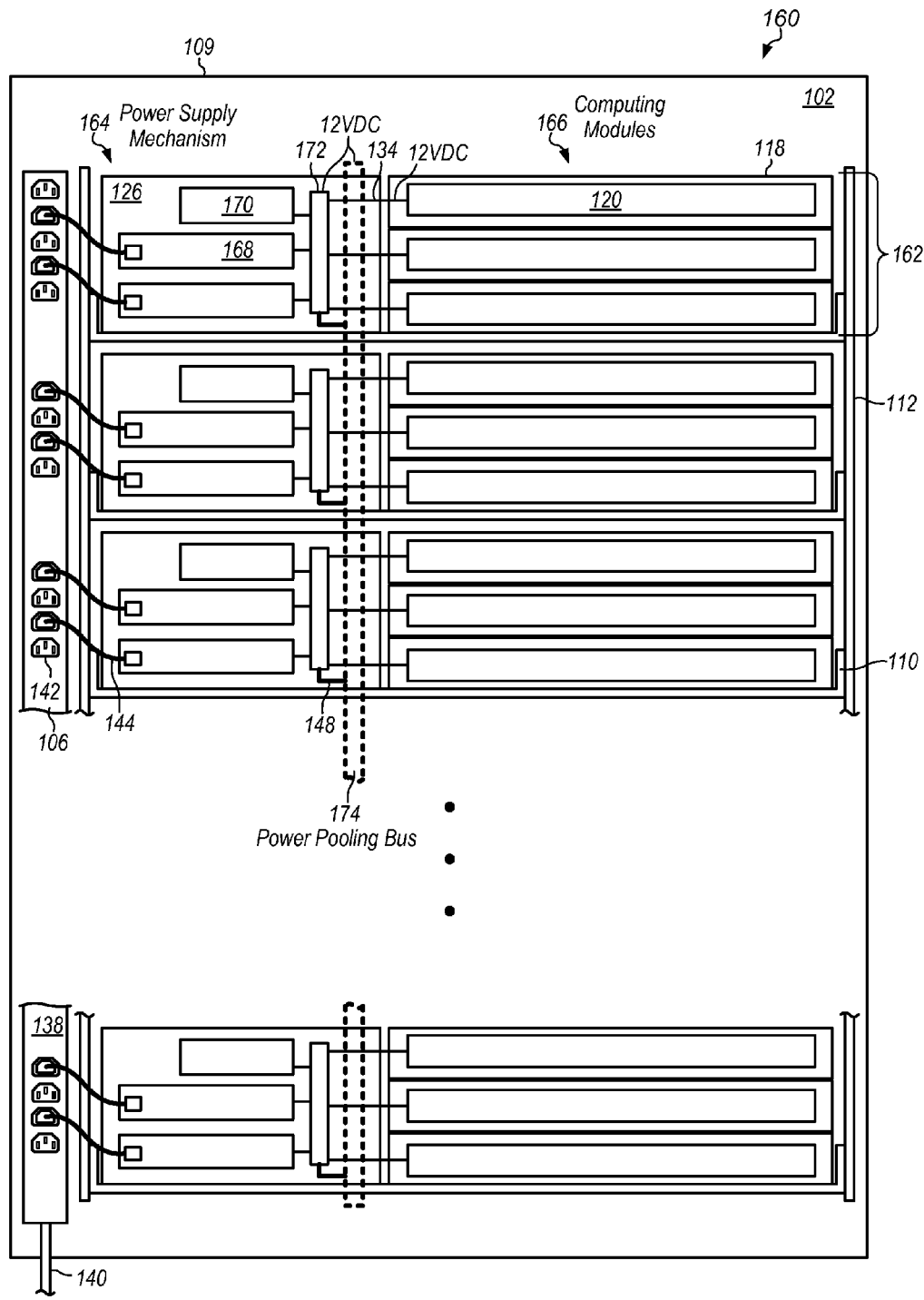
FIG. 2 illustrates a system having a multi-shelf power-pooling bus that supplies power directly to circuit board assemblies on shelf computing systems.

FIG. 2 illustrates a system having a multi-shelf pooled power bus that supplies power directly to circuit board assemblies on shelf computing systems. System 160 includes shelf computing systems 162 in rack 102. Shelf computing systems 162 include power supply mechanisms 164 and computing modules 166. Each of power supply mechanisms 164 includes power supply units 166, battery back-up unit 170, and local power bus 172. Local power buses 172 are coupled to circuit board assemblies 120 by way of power lines 134. Local power buses 172 are coupled to inter-shelf power pooling bus 174. Inter-shelf power pooling bus 174 may pool power from power supply mechanisms 164. Pooled power may be supplied to circuit board assemblies 120.

Power supply units 166 and battery back-up unit 170 may supply power to local power bus. In the embodiment illustrated in FIG. 2, power is supplied to local power buses 172 at 12 VDC, and power is pooled inter-shelf power pooling bus 174 at 12 VDC. In another embodiment, power is supplied to local power buses 172 at 48 VDC, and power is pooled inter-shelf power pooling bus 174 at 48 VDC.

In some embodiments, a power bus for pooling power from multiple slots or shelves in a rack is aggregated from bus elements on or in each of two or more shelf computing units. Each power bus in a rack may be build-as-you-go (for example, with no pre-existing bus for the shelf-level bus elements to connect to.)

Figure 3:
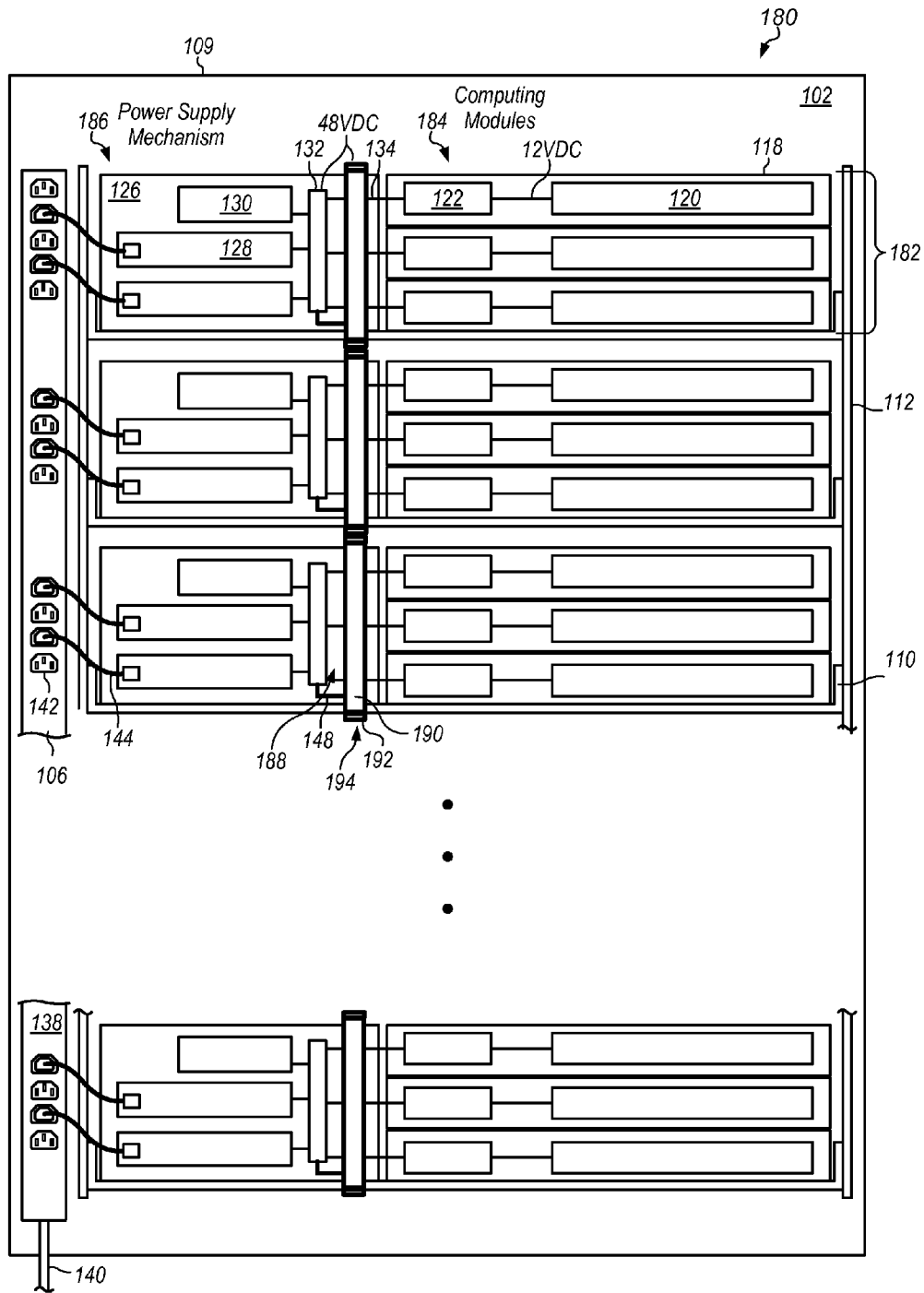
FIG. 3 illustrates one embodiment of a power bus aggregated from shelf-level power bus elements.

FIG. 3 illustrates one embodiment of a power bus aggregated from shelf-level power bus elements. System 180 includes shelf computing systems 182 in rack 102. Each of shelf computing systems 182 includes computing modules 184 and power supply mechanism 186. Each of power supply mechanisms 186 includes chassis 126, power supply units 128, battery back-up unit 130, and local power bus 132, and power bus element 188. Power bus element 186 may be attached to chassis 126. Power bus element 188 may be mounted inside or outside of chassis 126. Power bus element 188 may be electrically coupled to local power bus 132.

Power bus elements 188 include bus bar 190 and contacts 192. Bus bar 190 and contacts 192 may be electrically conductive. When power supply mechanisms 186 are fully installed in rack 102, power bus elements 188 may align with one another. Contacts 192 of adjacent shelf computing systems 182 may enter into sliding contact with one another such that power bus elements 188 of adjacent shelves couple with one another. In this manner, power bus elements 188 on a contiguous set of shelf computing systems (for example, shelf computing systems in the first three shelves of a rack), may form pooled power bus 194 for the shelf computing systems. Computing modules 184 in any of shelf computing systems in the set may draw power from pooled power bus 194.

In some embodiments, power bus elements may include resiliently engaging contacts. For example, contact 192 on either or both sides of a junction between elements may include a spring element that urges the contacts into engagement or otherwise includes a latching clip or similar mechanism which catches once the contact elements are seated.

In some embodiments, multiple power zones are created within a given rack by grouping shelf units to form multiple virtual buses. For example, bus elements on computing systems in shelves 1-4 of a rack may form power bus A, bus elements in computing systems in shelves 6-9 of the rack may form power bus B, and so on. Logically, each zone represents an independent unit of pooled power.

In some embodiments, a connecting element (for example, a bridge bar) is used to connect power bus elements in a multi-slot pooled power bus. Each connecting element may be a stand-alone element, or may be attached (for example, tethered) to one of the adjacent bus elements. In one embodiment, the connecting element is a clip. In some embodiments, a connecting element spans a gap between shelf computing units (for example, an empty slot in a rack).

In some embodiments, power is pooled among power supply mechanisms on two or more shelves using insulated power cables between shelves. For example, cables may be used to daisy chain among two or more local power buses to create an inter-shelf pooling power bus.

Figure 4:
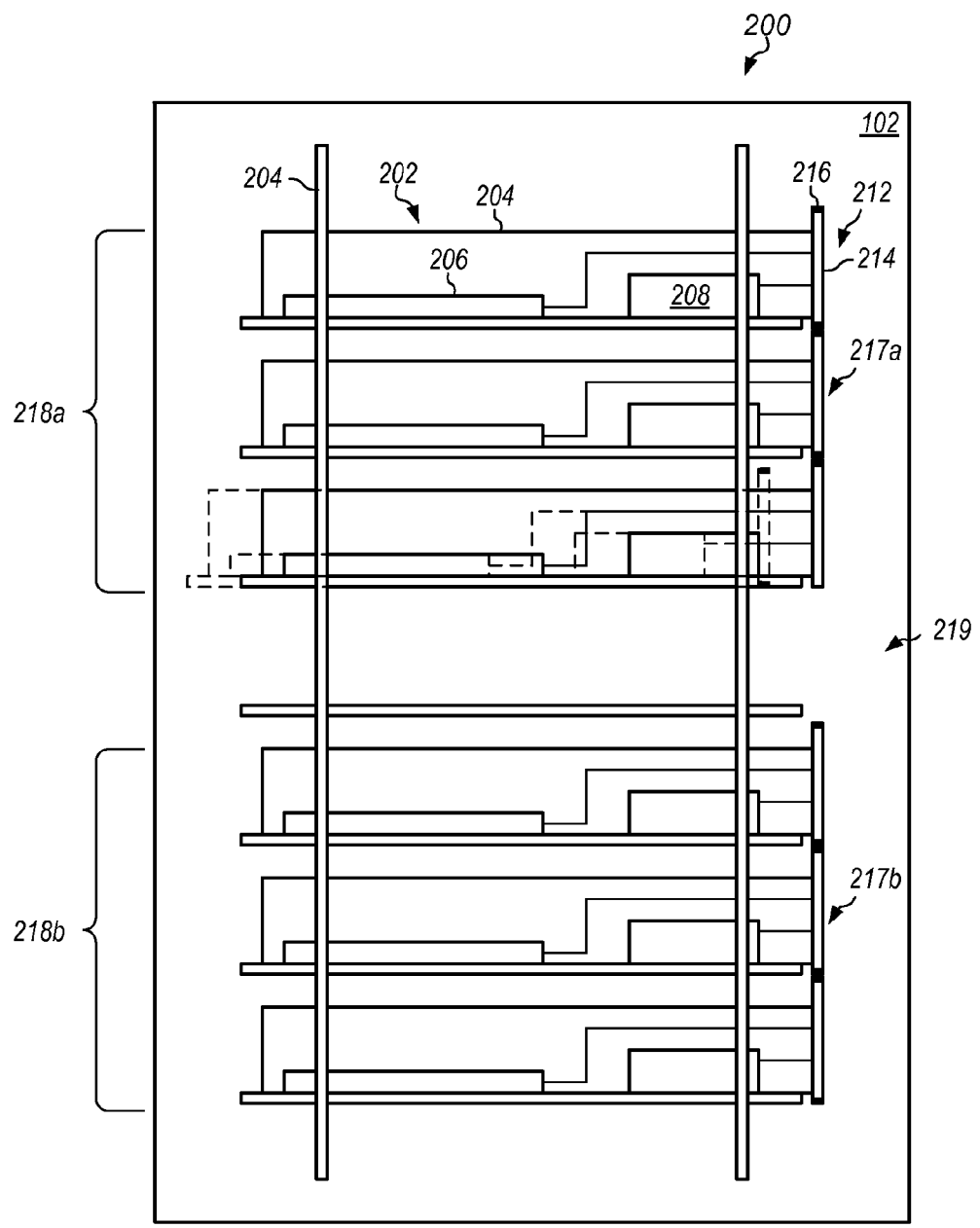
FIG. 4 illustrates one embodiment of a rack system with multiple pooled power zones formed by coupling power bus elements on shelf computing systems.

FIG. 4 illustrates one embodiment of a rack system with multiple pooled power zones formed by coupling power bus elements on shelf computing systems. System 200 includes rack 102 and shelf computing systems 202. Rack 102 includes side rails 204 and shelves 205. Each of shelf computing systems 202 include chassis 204, computing module 206, power supply unit 208, and power bus element 212.

Power bus elements 212 include bus bar 214 and contacts 216. Bus bar 214 and contacts 216 may be electrically conductive. When shelf computing systems 202 are fully installed in rack 102, power bus elements 212 may align with one another. Contacts 216 of adjacent shelf computing systems 202 may enter into sliding contact with one another such that power bus elements 212 of adjacent shelves couple with one another.

In the embodiment shown in FIG. 4, the power supply units 208 of the top three shelf computing systems 202 in rack 102 contribute power to pooled power bus 217a formed by the combination of power bus elements 212. Pooled power bus 217a supplies power to group 218a of shelf computing units 202. The power supply units 208 of the bottom three shelf computing systems 202 in rack 102 contribute power to a second pooled power bus 217b formed by the combination of power bus elements 212. Pooled power bus 217b supplies power to group 218b of shelf computing units 202. The lower pooled power bus is isolated from the upper pooled power bus by gap 219. In some embodiments, gaps (such as gap 219) are included between groups of rack-mounted computing units to establish multiple power zones within the rack. In some embodiments, gaps are used as a visual indicator of power zone groupings to maintenance personnel. In one embodiment, a gap between pooled power buses is a 1-rack unit (1 U) slot. Although only one gap is shown in FIG. 4 for illustrative purposes, a rack computing system may include any number of gaps and any number of pooled power zones.

In some embodiments, power bus elements 212 of shelf computing systems may be altered or adjusted by a user to connect or disconnect elements to achieve a desired grouping of power supply mechanisms in a rack. For example, a power bus element may include a movable tab that can be adjusted by a user to make or break a connection between bus elements on adjacent shelves, as desired. In certain embodiments, an electrical insulating element is used to isolate power supply mechanisms in pooled group from power supply mechanisms in another pooled group.

Figure 5:
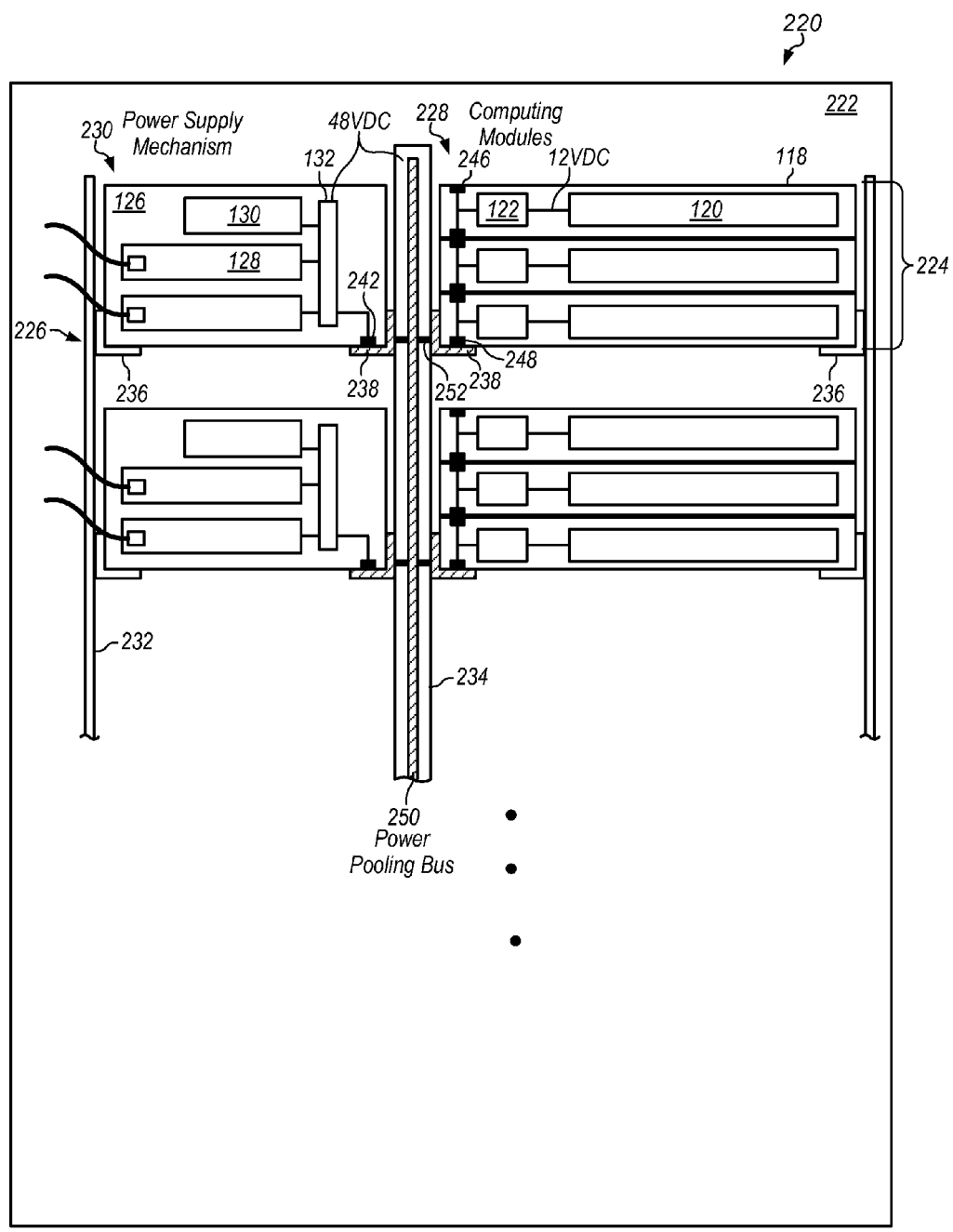
FIG. 5 illustrates one embodiment of a system with power pooled among shelf computing systems through supporting elements of shelves in the rack.

In some embodiments, power is pooled among power supply mechanisms on different shelves by way of electrical conductive elements in the shelf support structure. FIG. 5 illustrates one embodiment of a system with power pooled among shelf computing systems by way of supporting elements of the shelves in the rack. System 220 includes rack 222 and shelf computing systems 224. Shelf computing systems 224 are mounted in shelves 226. Shelf computing systems 224 each include three computing modules 228 in a stacked arrangement on the right side of rack 222 and power supply mechanism 230 on the left side of rack 222.

Rack 222 includes outside posts 232, interior post 234, outside shelf rails 236, and interior shelf rails 238. Computing modules 228 and power supply mechanism 230 are supported on outside shelf rails 236 and interior shelf rails 238.

Power supply mechanism 230 includes inter-shelf bus connector 242. Inter-shelf bus connector may be coupled to local power bus 132. Computing modules 228 include upper inter-shelf bus connector 246 and lower inter-shelf bus connector 248. Upper inter-shelf bus connector 246 and lower inter-shelf bus connector 248 may be coupled to DC/DC converter 122 of computing module 228. Contacts of upper inter-shelf bus connector 24, lower inter-shelf bus connector 248, and inter-shelf bus connector 242 may at the surface of power supply mechanism chassis 126 and computing module chassis 118. In certain embodiments, DC/DC converter is omitted and power is consumed from an inter-shelf bus directly by a circuit board assembly (for example, at 48 VDC or 12 VDC).

Inter-shelf power bus 250 is mounted on or in interior post 234. All or part of interior shelf rails 238 may be electrically conductive. The electrically conductive portion of interior shelf rails 238 may be electrical coupled to inter-shelf power bus 250 by way of electrical conductive pins 252. When computing modules 228 and power supply mechanism 230 are installed on shelves 226, contacts of upper inter-shelf bus connector 24, lower inter-shelf bus connector 248, and inter-shelf bus connector 242 couple with interior shelf rails 238. In some embodiments, lower inter-shelf bus connector 248, and inter-shelf bus connector 242 include contacts that slide into contact with interior shelf rails 238. Local power buses 132 of power supply mechanisms 238 and DC/DC converters of computing modules 228 interior shelf rails 238 may be coupled to pooling power bus 250. Pooling power bus 250 may draw power from power supply mechanisms 238 and supply power to electrical loads in any or all of computing modules 228. In the embodiment shown in FIG. 5, the power pooling bus is shown for illustrative purposes at 48 VDC. As with the embodiments described above, however, a power pooling bus may be any suitable voltage (for example, 12 VDC, 60 VDC). In certain embodiments, a power pooling bus supplies power at high voltage DC. In one embodiment, a power pooled bus supplies power at about 400 VDC.

Figure 6:
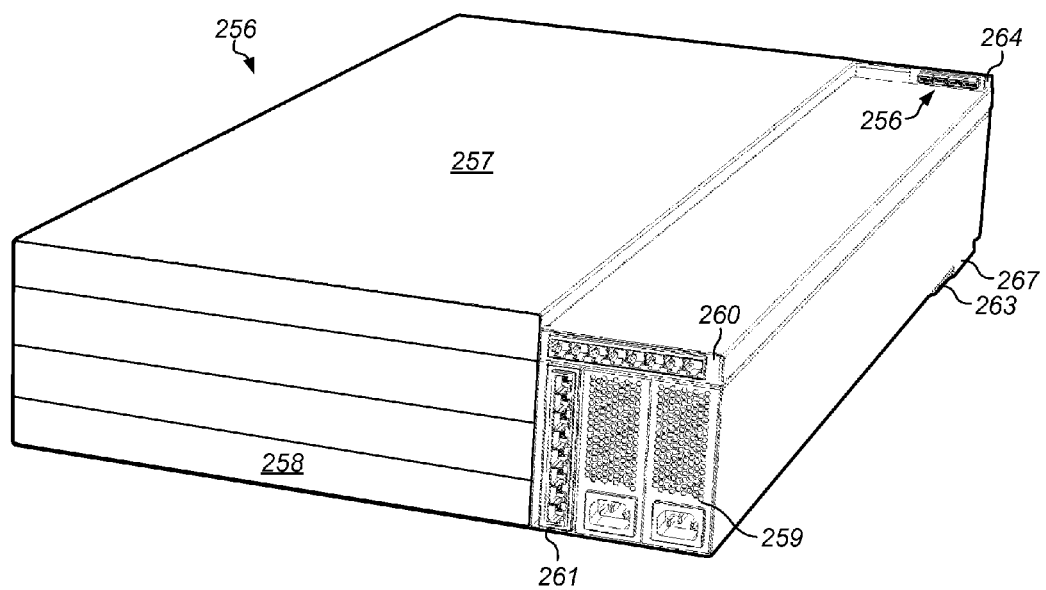
FIG. 6 illustrates one embodiment of a shelf computing unit with a local power bus element that can be used in forming a power bus with adjacent shelf computing units above and below.
Figure 7:
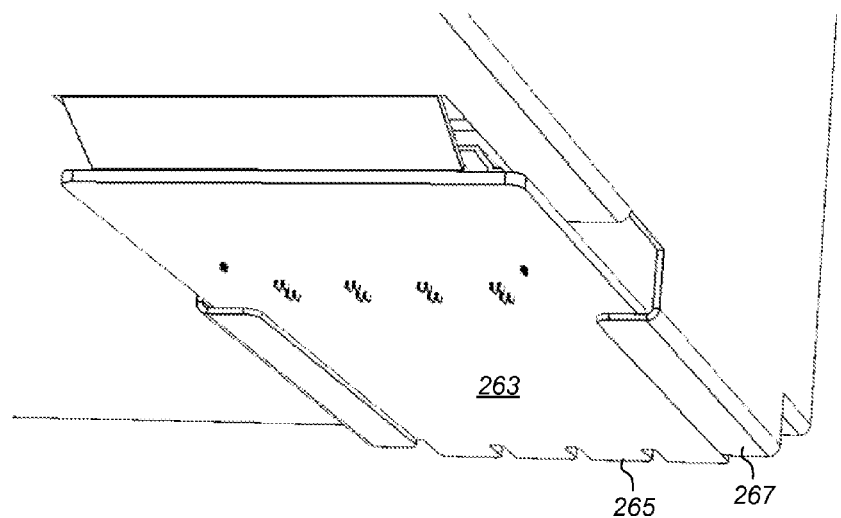
FIG. 7 illustrates one embodiment of a lower circuit board assembly having contacts that mate with a connector socket on an adjoining unit below.

FIG. 6 illustrates one embodiment of a shelf computing unit with a local power bus element that can be used in forming a power bus with adjacent shelf computing units above and below. FIG. 7 illustrates one embodiment of a lower circuit board assembly having contacts that mate with a connector socket on an adjoining unit below. Shelf computing unit 256 includes chassis 257, computing modules 258, power supply units 259, data interconnect module 260, power interconnect module 261, lower bus interconnect circuit board 263, and local bus circuit board 264. Lower interconnect circuit board includes inter-shelf edge connector 265. Local bus circuit board 264 includes inter-shelf connector socket 266. Lower bus interconnect circuit board 263 is carried on rails 267.

Power supply units 259 may be commonly connected to power interconnect module 261. Power interconnect module 261 may supply power to computing modules 258. In some embodiments, shelf computing unit 256 includes a battery back-up unit. The battery back-up unit may be connected to power interconnect module 261. Data interconnect module 260 may provide data connections among computing modules 258 in shelf computing unit 256. Data interconnect module 260 may also provide data connections between computing modules 258 and systems external to shelf computing unit 256.

Figure 8:
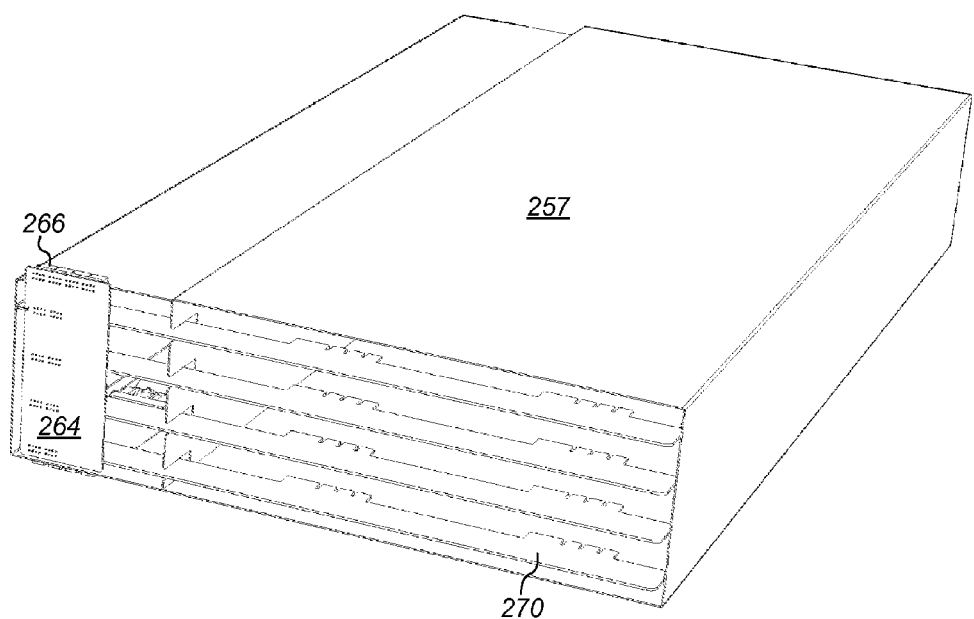
FIG. 8 illustrates a rear view of a shelf computing unit.

FIG. 8 illustrates a rear view of a shelf computing unit. In this illustration, a rear panel of chassis 257 is shown removed for clarity to show computing module interconnect circuit boards 270. Each of computing module interconnect circuit boards 270 include connectors (for example, board edge connectors) for connecting with a motherboard of one of computing modules 258 to local power bus circuit board 264, power supply units 259, data interconnect module 260, and power interconnect module 261 (computing module motherboards are omitted from FIG. 8 for clarity).

Figure 9:
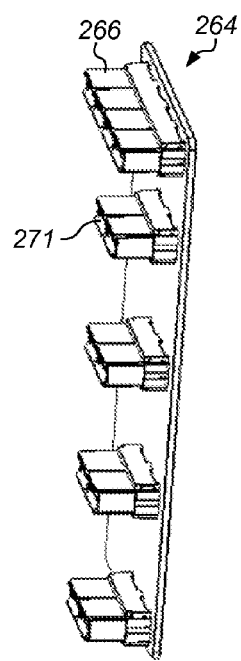
FIG. 9 illustrates a local power bus circuit board with an inter-shelf connector.

FIG. 9 illustrates a local power bus circuit board with an inter-shelf connector. Local power bus circuit board 264 includes inter-shelf connector socket 266 and computing module connector socket 271. Each of computing module connector sockets 271 may mate with board edge connector on one of computing module interconnect circuit boards 270. Local power bus circuit board 264 may pool power from power supply units 259, and supply power to all of computing modules 258.

Figure 10:
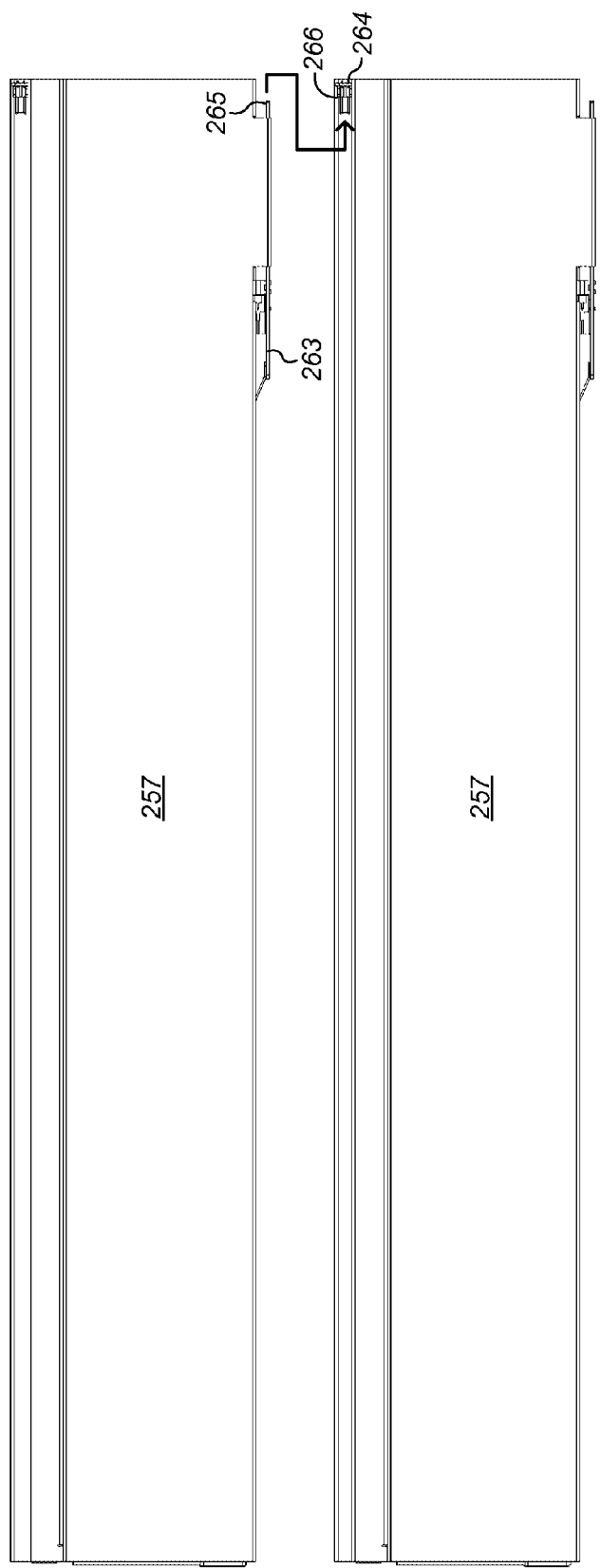
FIG. 10 illustrates adjacent shelf computing units with complementary connectors for an inter-shelf power bus.

FIG. 10 illustrates adjacent shelf computing units with complementary connectors for an inter-shelf power bus. When shelf computing units 256 are installed in vertically adjacent shelves in a rack, inter-shelf edge connector 265 on lower interconnect circuit board 263 may mate with inter-shelf connector socket 266 on local power bus circuit board 264 of the adjacent shelf computing unit below (as indicated by the arrow shown in FIG. 10). As installed, mated inter-shelf edge connector 265 and inter-shelf connector socket 266 may vertically overlap with one another. Inter-shelf edge connector 265 may be in the same horizontal plane as the opening of inter-shelf connector socket 266, such that inter-shelf edge connector 265 engages in inter-shelf connector socket 266 as the upper shelf computing unit is advanced forward.

Figure 11:
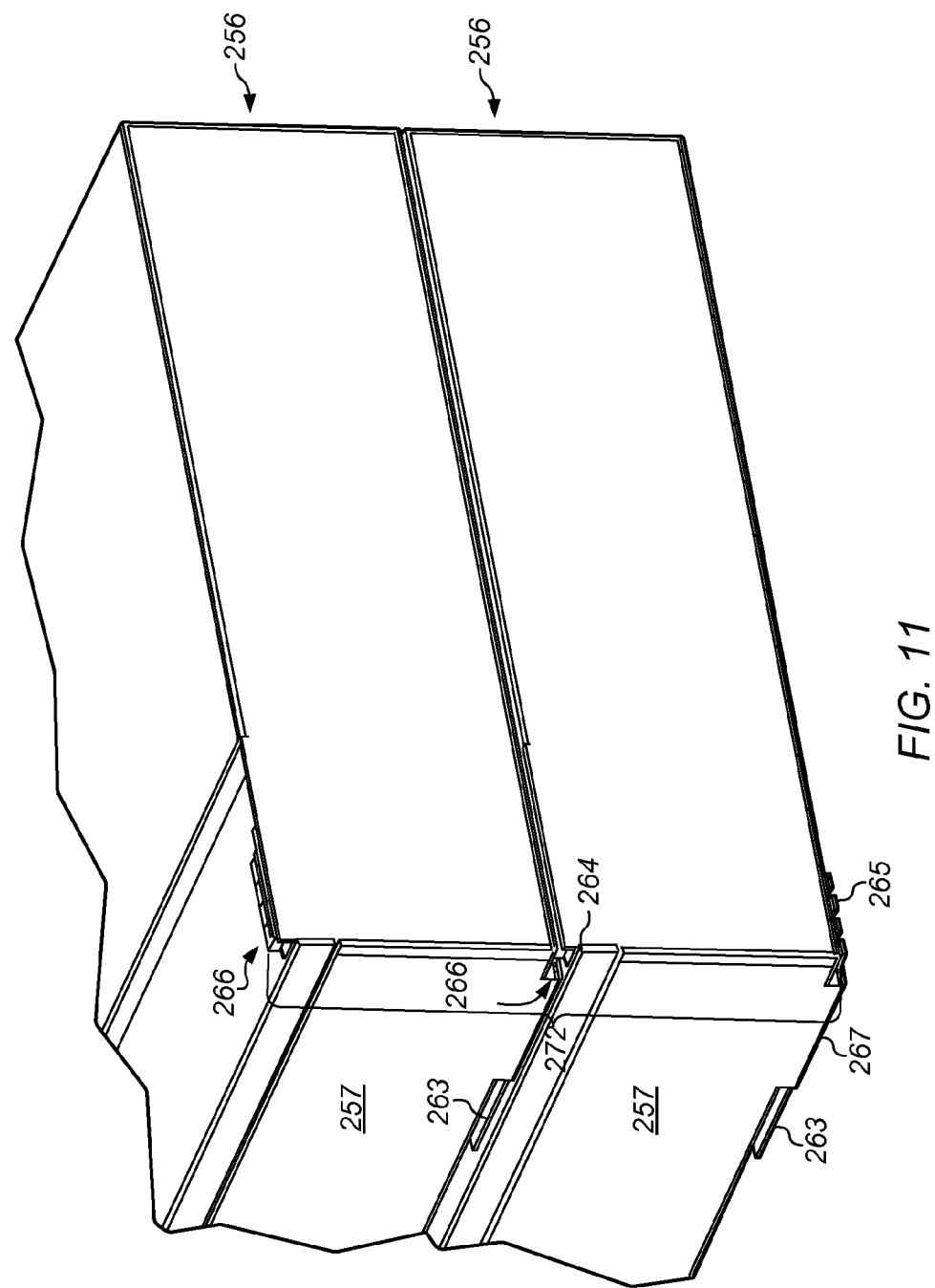
FIG. 11 illustrates a rear view of with adjacent shelf computing units with power bus elements coupled to one another.

FIG. 11 illustrates a rear view of with adjacent shelf computing units with power bus elements coupled to one another. Local power bus circuit boards 264 from shelf computing units 256 may combine to create inter-shelf power bus 272. Inter-shelf power bus 272 may pool power from power supply units on shelf computing units 256, and supply the pooled power to computing devices in the shelf computing units 256. In some embodiments, shelf computing units 256 are grouped into power zones, each having two or more shelf computing units, such as those described above relative to FIG. 5. Each power zone may pool power for separate set of shelf computing units. In certain embodiments, a group is formed by leaving an open slot between two of shelf computing units 256 in the rack.

In some embodiments, pool bus elements including a mechanism for electronically isolating power bus elements on shelf computing units from one another. For example, local power bus circuit board 264 may include circuit elements to isolate one or both of inter-shelf edge connector 265 at the bottom of a unit and inter-shelf connector socket 266 at the top of that same unit from one another, or from one or more power supply units 259. Elements of a power bus segment may be isolated in response to an external signal or message, by logic on the circuit board, or a manual switch. In some embodiments, elements of a power bus segment are isolated based on conditions sensed by the circuit board.

Figure 12:
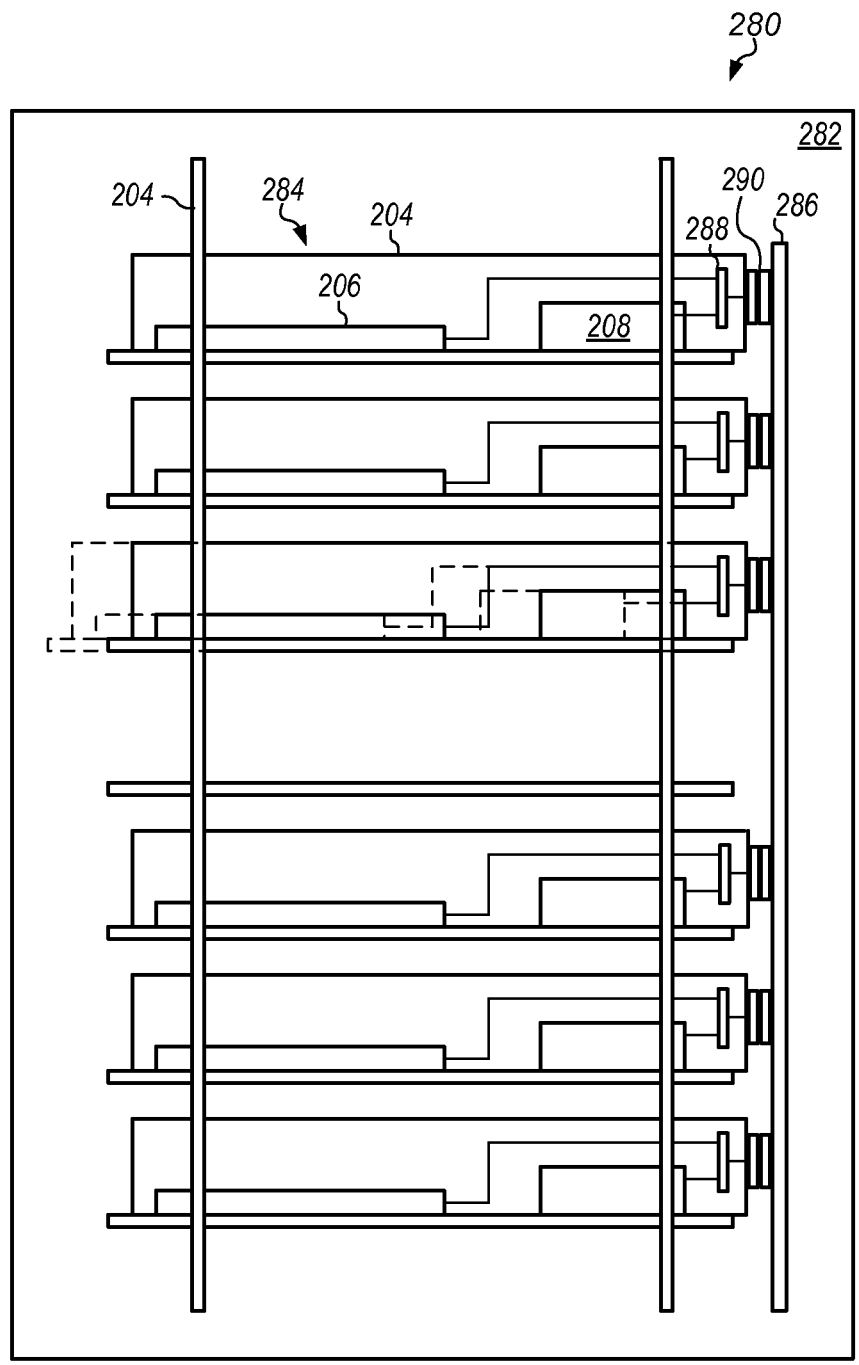
FIG. 12 illustrates a system with a rack-level power-pooling bus at the rear of a rack system.

FIG. 12 illustrates a system with a rack-level power-pooling bus at the rear of a rack system. System 280 includes rack 282 and shelf computing systems 284. Rack 282 includes rack-level power bus 286. Local power buses 288 of shelf computing systems 284 may couple to rack-level power bus 286 by way of blind-mate connectors 290. Rack-level power bus 286 may pool power from power supply units in shelf computing systems 284 and supply the pooled power to electrical loads in shelf computing systems 284.

In some embodiments, power pooled from power supply mechanisms of computing systems in multiple slots of a rack is controlled and optimized based on conditions of the power supply mechanisms and/or server loads. Power supply mechanisms in the pool may be activated or deactivated from the pool in response to the conditions. A power supply mechanism may be deactivated, for example, to maintain the utilization level of each remaining power supply mechanism in the pool above a desired minimum threshold. A power supply mechanism in one slot of the rack may be activated, for example, in response to a failure of a power supply mechanism in one or more other slots in the rack.

Figure 13:
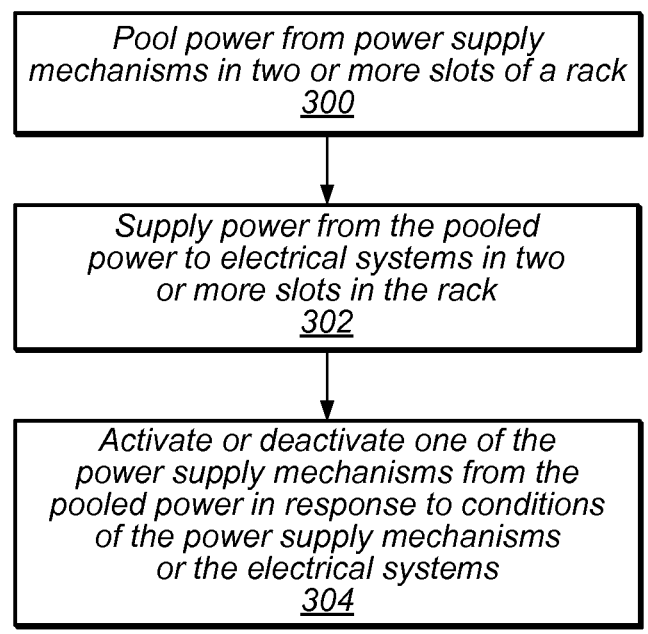
FIG. 13 illustrates one embodiment of managing power pooled from multiple slots of a rack.

FIG. 13 illustrates one embodiment of managing power pooled from multiple slots of a rack. At 300, power is pooled from power supply mechanisms in two or more slots of a rack. In one embodiment, each slot of the rack is a shelf that holds shelf computing system with a power supply mechanism.

At 302, power is supplied from the pooled power to electrical systems in two or more slots in the rack. Power may be supplied, for example, to motherboards, data storage devices, or other electrical loads in the shelf computing systems.

At 304, power supply mechanisms may be activated to, or deactivated from, the pool in response to conditions of the power supply mechanisms or the electrical systems. Activating power supply mechanisms in a pool may be used, for example, to augment a power supply to the electrical systems if additional power is needed for the electrical systems. Deactivating power supply mechanisms from a pool may be used, for example, to shed unneeded power from a power supply system in a rack, or to optimize operation of power supplies in the system.

In some embodiments, power supply mechanisms in a pool are activated or deactivated based on a protocol. The protocol may determine when a power supply mechanism need to be activated or deactivated from a pool, which power supply mechanisms in the system are to be activated or deactivated, or both. In certain embodiments, the protocol for activating or deactivated power supply devices is implemented by a rules engine. In one embodiment, the protocol for managing pooled power in a multi-shelf system is implemented by one control unit. In another embodiment, the protocol is implemented such that each power supply mechanism, or each power supply unit with a power supply mechanism, self-activates or self-deactivates based on measured conditions.

In some embodiments, operating condition criteria for activating or deactivating a power supply mechanism include power supply failures. A protocol may, for example, implement power supply activation/deactivation in a multi-shelf pool to achieve a desired level of a power resiliency in response to a power supply failures.

In some embodiments, operating condition criteria for activating or deactivating power supply mechanisms are based on utilization levels. A protocol may, for example, implement power supply activation/deactivation in a multi-shelf pool to achieve a desired level of power utilization for active power supplies in the system. In one embodiment, power supplies are activated or deactivated to maintain utilization levels of the active power supplies in a predetermined range (for example, between a predetermined minimum level and a predetermined maximum level). For example, if power utilization of the power supply units rises above 90%, additional power supply units may be activated in the pool. If power utilization of the power supply units falls below 50%, one or more of the power supply units may be deactivated from the pool.

In some embodiments, an activation/deactivation protocol may account for conditions of one or more battery back-up units in the power supply mechanisms in a pool. For example, if the charge state of battery back-up units in the system is low, a higher number of power supply mechanisms may be kept active.

Various criteria may be used to determine which of the power supply mechanisms or power supply units in a multi-shelf pooled system are activated or deactivated. Examples of criteria that may be used to select a power supply mechanism to activate or deactivate include: rack position, a serial number, a hash, power supply unit efficiency, or thermal considerations.

In some embodiments, pooled power for a group of shelves in a rack is controlled using power management system. In one embodiment, a power management system is coupled to each of the shelf computing systems in a group. The power management system may include a controller that can be operated to activate or deactivate power supply mechanisms, individual power supply units, or both, in multiple shelf computing systems. In one embodiment, the controller is a programmable logic controller.

Figure 14:
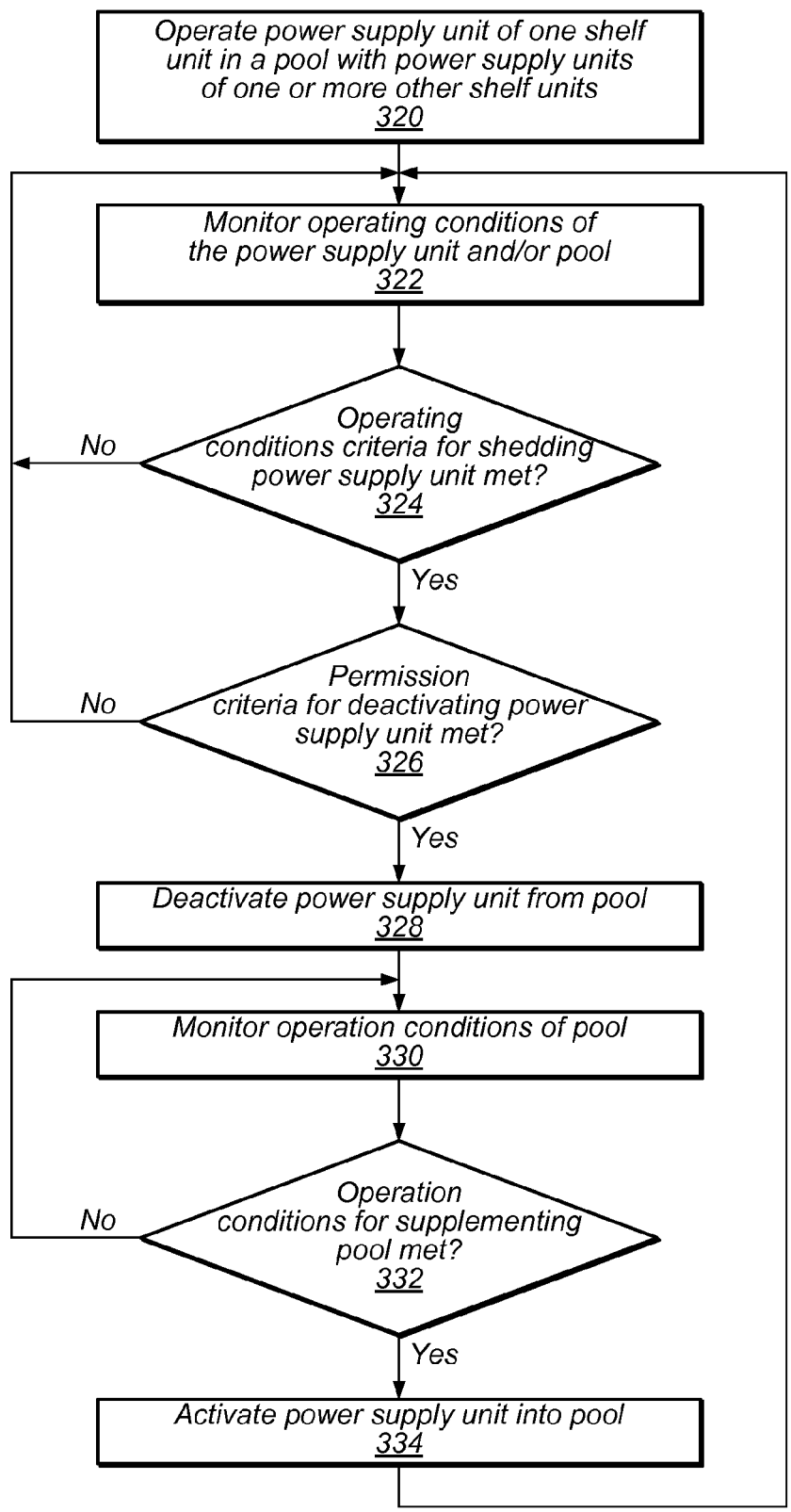
FIG. 14 illustrates one embodiment of activating and deactivating a power supply unit in an inter-shelf power pool based on operating conditions.

In some embodiments, an individual power supply mechanism in a shelf computing system includes a control device that can activate or deactivate the power supply mechanism in an inter-shelf power pool. The power supply mechanism may sense conditions in the power supply mechanism, electrical loads on the power supply mechanism or the power pool, or both. In response to the sensed conditions, the power supply mechanism may activate or deactivate power. FIG. 14 illustrates one embodiment of activating and deactivating a power supply unit in an inter-shelf power pool based on operating conditions.

At 320, a power supply unit of one shelf unit in a rack is operated in a pool with power supply units of one or more other shelf units in the rack. At 322, operating conditions of the power supply unit and/or the pool are monitored.

At 324, an assessment is made whether operating conditions criteria for shedding power supply unit from the pool are met. Such conditions may include, in one embodiment, where the power supply is operating below a predetermined utilization level (for example, below 50% of the rated output of the power supply unit). If the operating conditions criteria for shedding power supply unit from the pool are not met, the power supply unit may remain active in the pool to supply power to electrical loads on the power pool.

If the operation conditions for shedding the power supply unit from the pool are met, an assessment may be made of whether permission criteria for deactivating power supply unit are met at 326. The permission criteria may limit deactivation of the power supply unit based on factors external to the power supply unit. For example, permission criteria may restrict deactivation to within a particular periodic time window (such as between 0:05 and 0:10 of every minute).

In some embodiments, permission criteria may be implemented among two or more power supply units in a pool to coordinate deactivation of power supply units in the pool. For example, each of the power supply units in a pool may permit deactivation in a different periodic time window. In certain embodiments, permission criteria may be based on an identifier for the power supply unit, such as a serial number. For example, power supply units with serial numbers ending in a "1" may be permitted to turn off during one time window, power supply units with serial numbers ending in a "2" may be permitted to deactivate during a different time period, and so on.

At 328, if the permission criteria are met for the power supply unit, the power supply unit may be deactivated from the pool. At 330, once the power supply unit has been deactivated from the pool, the operating conditions of pool may be monitored. In some embodiments, monitoring includes assessing a utilization level of remaining power supply units in the pool.

At 334, if operation conditions criteria for supplementing power to the pool are met, the power supply unit may be re-activated to the pool. For example, if the utilization level of the active power supply units in the pool rises above 90% for a predetermined duration, the power supply unit may be re-activated.

In various embodiments described above, power supply mechanisms are shown for illustrative purposes as having a particular number of power supply units and battery back-up units. As noted above with respect to FIG. 1, however, a power supply mechanism may have any number of power supply units and any number of battery back-up units. In some embodiments, each shelf of a rack system has at least one of either a power supply unit or a battery back-up unit.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   a rack comprising a plurality of shelves;
   a plurality of shelf-mountable electrical systems, wherein respective ones of the plurality of shelf-mountable electrical systems are coupled to respective ones of the shelves, wherein the respective ones of the plurality of shelf-mountable electrical systems comprise one or more chassis, a shelf power supply mechanism configured to receive AC power from a power distribution system and supply DC power, and one or more shelf computing devices;
   an inter-shelf power-pooling bus coupled to the plurality of shelf-mountable electrical systems, wherein for a given shelf-mountable electrical system of the respective ones of the plurality of shelf-mountable electrical systems, the inter-shelf power pooling bus is coupled between:
      a DC power output of a shelf power supply mechanism of the given shelf-mountable electrical system; and
      a power input of a shelf computing device of the given shelf-mountable electrical system;
   wherein the inter-shelf power-pooling bus is configured to supply pooled power from the shelf power supply mechanisms coupled to the inter-shelf power bus to the shelf computing devices coupled to the inter-shelf power-pooling bus.

2. The system of claim 1, wherein the DC power supplied from the inter-shelf power-pooling bus is about 12 VDC or about 48 VDC.

3. The system of claim 1, wherein the DC power supplied from the inter-shelf power-pooling bus is high voltage DC power.

4. The system of claim 1, wherein at least one of the shelf-mountable electrical systems comprises one or more additional power supply mechanisms and a local power bus coupled to the power supply mechanism and the one or more additional power supply mechanisms of the at least one shelf-mountable electrical system, wherein at least one of the shelf computing devices of the at least one shelf-mountable electrical system is coupled to the local power bus.

5. The system of claim 1, wherein the power supply mechanism of a shelf-mountable electrical system coupled to a first shelf has a capacity that is less than the capacity required by the one or more shelf computing devices of the shelf-mountable electrical system coupled to the first shelf, wherein the power supply mechanism of a shelf-mountable electrical system coupled to a second shelf has a capacity that is greater than the capacity required by the computing devices of the shelf-mountable electrical system coupled to the second shelf, wherein the power-pooling bus is configured to conduct excess power from the second shelf to the first shelf.

6. A system, comprising:
   a rack comprising a plurality of shelves;
   a plurality of shelf-mountable electrical systems, wherein respective ones of the plurality of shelf-mountable electrical systems are coupled to respective ones of the shelves, wherein the respective ones of the plurality of shelf-mountable electrical systems comprise one or more chassis, a shelf power supply mechanism, and one or more shelf computing devices;
   an inter-shelf power-pooling bus coupled to the plurality of shelf-mountable electrical systems, wherein for a given shelf-mountable electrical system of the respective ones of the plurality of shelf-mountable electrical systems, the inter-shelf power pooling bus is coupled between:
      a power output of a shelf power supply mechanism of the given shelf-mountable electrical system; and
      a power input of a shelf computing device of the given shelf-mountable electrical system;
   wherein the inter-shelf power-pooling bus is configured to supply pooled power from the shelf power supply mechanisms coupled to the inter-shelf power bus to the shelf computing devices coupled to the inter-shelf power-pooling bus.

7. The system of claim 6, wherein the pooled power supplied to the shelf computing devices is DC power, wherein the system further comprises one or more DC/DC converters, wherein at least one of the one or more DC/DC converters is configured to receive DC power from the inter-shelf power-pooling bus at a first voltage and to supply power to at least one of the shelf computing devices at a second voltage that is lower than the first voltage.

8. The system of claim 6, wherein the pooled power supplied to the shelf computing devices is DC power, wherein the DC power supplied from the inter-shelf power-pooling bus is about 48 VDC.

9. The system of claim 6, wherein the pooled power supplied to the shelf computing devices is DC power, wherein the DC power supplied from the inter-shelf power-pooling bus is about 12 VDC or about 48 VDC.

10. The system of claim 6, wherein the pooled power supplied to the shelf computing devices is high voltage DC power.

11. The system of claim 6, wherein the power supply mechanisms are configured to supply pooled power to the inter-shelf power-pooling bus to tolerate a failure of at least one of the power supply mechanisms.

12. The system of claim 6, wherein the power supply mechanism of a shelf-mountable electrical system coupled to a first shelf has a capacity that is less than the capacity required by the one or more shelf computing devices of the shelf-mountable electrical system coupled to the first shelf, wherein the power supply mechanism of a shelf-mountable electrical system coupled a second shelf has a capacity that is greater than the capacity required by the computing devices of the shelf-mountable electrical system coupled to the second shelf, wherein the power-pooling bus is configured to conduct excess power from the second shelf to the first shelf.

13. The system of claim 6, wherein the power supply mechanism on at least one of the shelves comprises at least one battery back-up unit.

14. The system of claim 6, wherein the power supply mechanism on at least one of the shelves comprises at least one power supply unit.

15. The system of claim 6, wherein the power supply mechanism on at least one of the shelves comprises at least one power supply unit and at least one battery back-up unit.

16. The system of claim 6, wherein at least one of the shelf-mountable electrical systems comprises a local bus between the power supply mechanism and the shelf computing devices, wherein the local bus is configured to couple the computing devices to two or more power supply units, or to one or more power supply units and one or more battery back-up units.

17. The system of claim 6, wherein the inter-shelf power-pooling bus comprises one or more blind-mate connectors configured to couple with the power output of the power supply mechanisms of two or more of the shelf-mountable electrical systems when the shelf-mountable electrical systems are installed in the rack.

18. The system of claim 6, wherein the inter-shelf power-pooling bus comprises one or more bus connectors on at least one of the shelves, wherein at least one of the shelf-mountable electrical systems comprises one or more power bus connectors configured to couple with at least one of the bus connectors on the at least one shelf.

19. The system of claim 6, wherein the inter-shelf power-pooling bus comprises one or more insulated power cables configured to couple the power outputs of power supply mechanisms of the shelf-mountable electrical systems coupled to two or more of the shelves.

20. The system of claim 6, wherein the inter-shelf power-pooling bus is formed from power bus elements on each of at least two of the shelf-mountable electrical systems.

21. The system of claim 6, wherein the system is configured to activate or deactivate one or more power supply units in at least one of the power supply mechanisms in response to conditions in the power supply mechanisms or in the electrical systems.

22. A method of supplying power to electrical systems in a rack, comprising:
   coupling a power output of a power supply mechanism in one shelf of a plurality of shelves in the rack to an inter-shelf power pooling bus, wherein the inter-shelf power pooling bus is coupled between the power output of the power supply mechanism in the one shelf and a power input of a shelf-computing device in the one shelf;
   coupling one or more power outputs of one or more additional power supply mechanisms in one or more additional shelves of the plurality of shelves in the rack to the inter-shelf power pooling bus, wherein the inter-shelf power pooling bus is coupled between the power outputs of the one or more additional power supply mechanisms in the one or more additional shelves and one or more corresponding respective power inputs of one or more additional shelf-computing devices in respective ones of the one or more additional shelves; and
   supplying power from the inter-shelf power pooling bus to the shelf-computing device in the one shelf and the one or more additional shelf computing devices in the one or more additional shelves of the plurality of shelves in the rack.

23. The method of claim 22, wherein the power supplied from the inter-shelf power pooling bus is DC power.

24. The method of claim 22, wherein supplying power from the inter-shelf power pooling bus to the shelf-computing device in the one shelf in the rack and the one or more additional shelf computing devices in the one or more additional shelves in the rack comprises supplying excess power from a power supply mechanism on a particular one of the shelves to computing devices on another shelf of the rack.

25. The method of claim 22, wherein the inter-shelf power pooling bus is formed from power bus elements coupled to power supply mechanisms on at least two of the shelves.

26. The method of claim 22, further comprising controlling an amount of electrical power collectively fed into the inter-shelf power pooling bus, wherein controlling the amount of electrical power collectively fed into the inter-shelf power pooling bus comprises activating or deactivating a power supply unit in at least one of the power supply mechanisms in response to conditions in the power supply mechanisms or in response to conditions in the shelf computing device or the one or more additional shelf computing devices.

* * * * *